United States Patent [19]
Hodgson et al.

[11] Patent Number: 5,440,233
[45] Date of Patent: Aug. 8, 1995

[54] ATOMIC LAYERED MATERIALS AND TEMPERATURE CONTROL FOR GIANT MAGNETORESISTIVE SENSOR

[75] Inventors: Rodney T. Hodgson, Ossining; Paul M. Marcus, Briarcliff Manor; Victor L. Moruzzi, Wappingers Falls, all of N.Y.

[73] Assignee: International Business Machines Corporation, Armonk, N.Y.

[21] Appl. No.: 56,003

[22] Filed: Apr. 30, 1993

[51] Int. Cl.[6] .................. G01R 33/02; G11B 5/39; G11B 5/12; H01L 43/00

[52] U.S. Cl. ................. 324/252; 324/207.21; 324/224; 360/113; 365/158; 338/32 R

[58] Field of Search ............ 324/207.21, 224, 252; 338/32 R; 360/110, 113; 148/120, 121, 122, 509; 420/459, 456; 365/158, 171, 8

[56] References Cited

U.S. PATENT DOCUMENTS

| | | | |
|---|---|---|---|
| 3,607,460 | 9/1971 | Lommel | 148/31.55 |
| 3,609,719 | 9/1971 | Lommel | 340/174 TF |
| 3,637,442 | 1/1971 | Kouvel et al. | 348/120 |
| 4,012,781 | 3/1977 | Lin | 324/252 |
| 4,023,965 | 5/1977 | Suits | 75/170 |
| 4,103,315 | 7/1978 | Hempstead et al. | 360/110 |
| 4,476,454 | 10/1984 | Aboaf et al. | 338/32 R |
| 4,755,897 | 7/1988 | Howard | 360/113 |
| 4,782,413 | 11/1988 | Howard et al. | 360/113 |
| 4,949,039 | 8/1990 | Grunberg | 324/252 |
| 5,001,586 | 3/1991 | Aboaf et al. | 360/113 |
| 5,014,147 | 5/1991 | Parkin et al. | 360/113 |
| 5,159,513 | 10/1992 | Dieny et al. | 360/113 |

FOREIGN PATENT DOCUMENTS

| | | | |
|---|---|---|---|
| 4149812 | 5/1992 | Japan | C11B 5/39 |
| 2016788 | 9/1979 | United Kingdom | B11B 5/30 |
| 1534082 | 6/1988 | U.S.S.R. | C22C 5/00 |

OTHER PUBLICATIONS

Temperature Regulated Bismuth Resistor with Magnetic Field Measurement Dols et al., The Review of Scientific Instruments, vol. 29, #5, Masy 1958.

J. S. Kouvel et al., J. Appl. Phys. Supp. Co vol. 33, 1343 (1962).

Primary Examiner—Sandra L. O'Shea
Assistant Examiner—Jay M. Patidar
Attorney, Agent, or Firm—Robert M. Trepp

[57] ABSTRACT

An apparatus and method for detecting a magnetic field has been described incorporating a material which switches from an antiferromagnetic order to a ferromagnetic order upon the application of a magnetic field and wherein the material is FeRh, FeRu, FePd or MnPt, a heating element for controlling the temperature of the material and a current source for sensing the change of resistance of the material to determine when the material is ferromagnetically ordered. The invention overcomes the problem of small changes in resistance of magnetoresistive sensors operating in only the ferromagnetic order.

31 Claims, 5 Drawing Sheets

ATOMIC LAYERED MATERIALS AND TEMPERATURE CONTROL FOR GIANT MAGNETORESISTIVE SENSOR

BACKGROUND OF THE INVENTION

1. Field of the Invention

This invention relates to sensors for detecting magnetic fields, and more particularly, to a magnetoresistive sensor utilizing a metallic compound which undergoes a electronic phase transition in a magnetic field form an antiferromagnetic state to a ferromagnetic state and vice versa when the magnetic field is removed and has a corresponding "giant magnetoresistive effect".

2. Description of the Prior Art

Magnetoresistive devices exhibit a change of resistance to current passing therethrough when the magnetic field is changed. Typically, two layers of ferromagnetic material are used to form a magnetoresistive device and wherein the field intercepted by the magnetoresistive device exceeds the coercivity of one of the layers in order to provide a change in direction of the magnetization in one of the layers. Magnetoresistive devices have been used for detecting magnetic fields from magnetic tape and direct access storage devices (DASD). For example, a magnetoresistive device is positioned in a head attached to a slider in a DASD. The head is positioned over a magnetic layer on a rotating disk and detects magnetic fields emanating from the magnetic layer indicative of data stored therein. Examples of magnetoresistive devices are described in U.S. Pat. No. 4,476,454 which issued on Oct. 9, 1984 to J. A. Aboaf et al. which describes devices and circuits employing magnetoresistive materials exhibiting a negative ($\Delta\rho$) change in resistivity effect. A more recent magnetoresistive device showing a $\Delta\rho=9$ with a magnetic field in the range from 20 to 120 Oe is described in U.S. Pat. No. 5,159,513 which issued on Oct. 27, 1992 to B. Dieny et al. entitled, "Magnetoresistive Sensor Based on the Spin Valve Effect".

While a change of 9% resistivity may seem large, there is a need in the industry to have magnetoresistive devices which exhibit changes in resistivity greater than 9% at a lower magnetic field.

Some magnetoresistive sensors have utilized an antiferromagnetic layer to provide a longitudinal exchange bias in a ferromagnetic layer. The exchange bias merely fixes the direction of magnetization in the ferromagnetic layer. One such device, is described in U.S. Pat. No. 5,014,147 which issued on May 7, 1991 to S. P. Parkin et al. which uses an alloy from $Fe_{(1-x)}Mn_x$ where x is within the range of 0.3 to 0.4, as an antiferromagnetic layer.

Certain metallic compounds have been known to undergo a magnetic phase transition from antiferromagnetic (AF) to ferromagnetic (FM) that are found in nature as well as fabricated or formulated in a laboratory. One such metallic compound is iron rhodium (FeRh). Iron rhodium undergoes a phase transition at about 340 K. from antiferromagnetic to ferromagnetic. The phase transition is accompanied by an abrupt increase in the specific volume of iron rhodium. It has been published that the transition temperature of iron rhodium can be lowered by applying a magnetic field $H_{cr}$ and that the transition temperature can be raised by applying a positive pressure $P_{cr}$. Experiments by J. S. Kouvel and C. C. Harteluis, J. Appl. Phy., Supp. to Vol. 33, 1343 (1962) on a crude polycrystalline sample of FeRh showed a 30 percent drop in resistivity on heating through the magnetic phase transition.

The use of iron-rhodium films and alloys thereof for magnetic recording was described in U.S. Pat. No. 3,607,460 which issued on Sep. 21, 1971 To J. M. Lommel. In '460, an electron beam heated individual regions through a first order transition to the ferromagnetic state whereupon the regions are permitted to cool to a biasing temperature slightly higher than the temperature of the transition back to an antiferromagnetic state. A magnetic field was then applied to the entire film to magnetize only those regions of the film in the ferromagnetic state and read out of the recorded information was achieved by conventional electron beam microscopy. The ferromagnetism of the film could be erased by cooling the film below the transition temperature to the antiferromagnetic state or by the application of a strain to the film.

SUMMARY OF THE INVENTION

In accordance with the present invention, an apparatus and method for detecting a magnetic field is described comprising a material consisting of at least one type of magnetic atom or ion such as Fe and at least one type of nonmagnetic atom or ion such as Rh, Ru or Pd, the magnetic atoms or ions being regularly arrayed in a crystal interspersed with the nonmagnetic atoms or ions, the magnetic atoms or ions being antiferromagnetically aligned with all nearest-neighbor magnetic atoms or ions at first times when the applied magnetic field to be detected is below a first predetermined value, the magnetic atoms or ions being changed to ferromagnetic order at second times when the magnetic field to be detected is above a second predetermined value, a temperature control circuit coupled to a heating element for controlling the temperature of the material within a predetermined temperature range, and an electrical current source for passing current through the material for determining times when the material is ferromagnetically ordered.

The invention further provides a magnetoresistive sensor in the head of a head/disk assembly comprising a material consisting of FeRh having a surface adapted for positioning in the proximity of the surface of the disk, a temperature control circuit coupled to a heating element for controlling the temperature of the material within a predetermined temperature range, a current source for passing electrical current through the material, and a data circuit for generating a signal indicative of the data stored in response to the voltage across the material.

BRIEF DESCRIPTION OF THE DRAWINGS

These and other features, objects, and advantages of the present invention will become apparent upon a consideration of the following detailed description of the invention when read in conjunction with the drawing, in which.

DESCRIPTION OF THE PREFERRED EMBODIMENT

Figure 1:
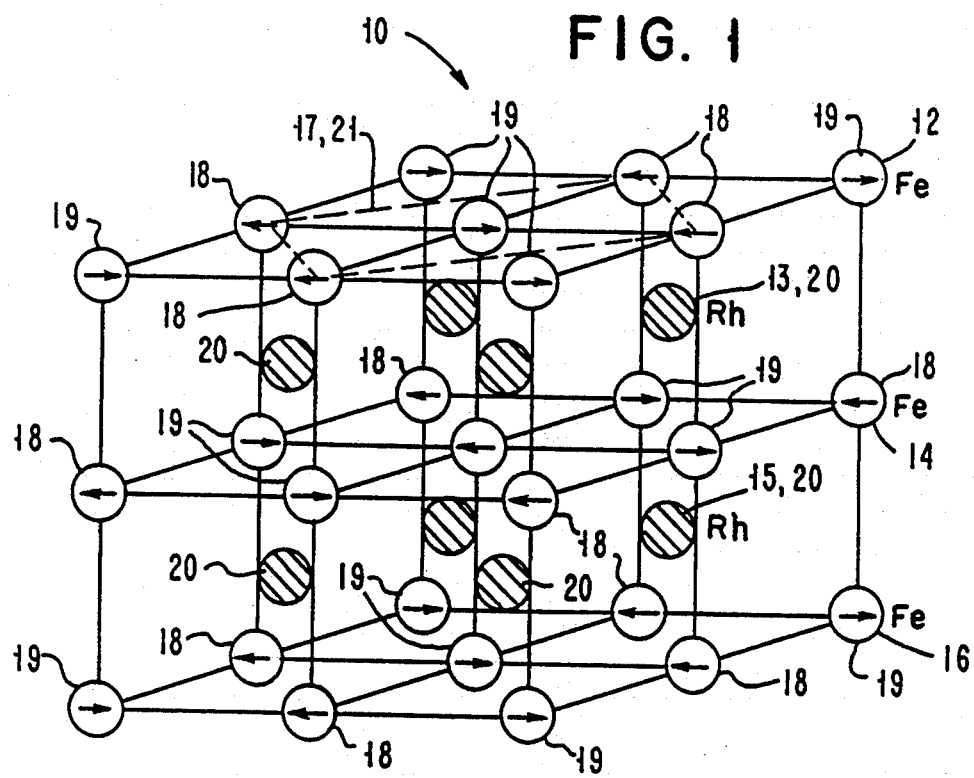
FIG. 1 is a schematic diagram of a type II antiferromagnetic spin configuration for ordered FeRh.

Referring now to the drawing, FIG. 1 shows a schematic diagram of a type II antiferromagnetic spin configuration for ordered FeRh. It is noted that FeRh, as shown in FIG. 1, is naturally occurring and comprises monolayers 12, 14 and 16 of magnetic iron which are spaced apart by monolayers 13 and 15 of nonmagnetic rhodium atoms. Monolayers 12 through 16 are stacked in the (100) direction corresponding to a CsCl type unit cell which has long been known to exhibit a transition from antiferromagnetic to ferromagnetic order. A unit cell 17 of FeRh is shown in layer 12 by dashed line 21 which passes through four Fe atoms at the corners of unit cell 17. Each corner Fe atom contributes one eighth atom to the unit cell. In layer 14 the unit cell passes through four Fe atoms on the edge of unit cell 17 which is directly below a projection of dashed line 21. Each edge atom contributes one quarter atom to unit cell 17. Layer 16 is the lowest layer of unit cell 17 and has an Fe atom at each of four corners which contributes one eighth atom from each corner to the unit cell. Thus, layer 12 contributes one and one half atoms of Fe, layer 14 contributes two atoms of Fe and layer 16 contributes one and one half atoms of Fe for a grant total of 4 Fe atoms. Layers 13 and 15 each have 4 atoms of Rh on a respective face of unit cell 17. Each face atom of Rh contributes one half atom of Rh to the unit cell. Thus, layer 13 and 15 each contribute 2 Rh atoms to unit cell 17 for a grand total of 4 Rh atoms in unit cell 17.

Iron atoms 18 of monolayers 12, 14 and 16 are oriented in a first direction while iron atoms 19 are oriented in a second direction opposite the first direction. Monolayers 13 and 15 comprise nonmagnetic rhodium irons at times when FeRh is antiferromagnetic. The electronic phase transition and the associated switching of the magnetic order between the magnetic layers 12, 14 and 16 can be induced by either an increase in temperature or by an applied magnetic field. The orientation of the atoms shown in FIG. 1 has the unusual property of being antiferromagnetic at low temperatures and of undergoing a phase transition to a ferromagnetic state at about 340 K. depending on stoichiometry and may be as low as 320 K. The antiferromagnetic-ferromagnetic transition can be induced at temperatures below 340 K. by an applied magnetic field which goes linearly to 0 as the temperature approaches 340 K. The magnetic field is about 40 kOe at room temperature and is about 140 Oe at a temperature of 0.1 K. below the transition temperature. In FIG. 1, when FeRh is ferromagnetic, all iron atoms are pointed in a first direction shown by iron atoms 18 or all iron atoms are pointed in a second direction shown by iron atoms 19. In FIG. 1, the coupling between iron monolayers 12, 14 and 16 is sufficiently large that the energy difference between the antiferromagnetic and the ferromagnetic state is a few tenths of a mRy/atom. Calculations of the energy of FeRh, as shown in FIG. 1, have shown that the ground state (the lowest energy state) is indeed antiferromagnetic, and moreover, that it is type II antiferromagnetism, which consists of (100) iron layers with alternating spins within the planes, i.e. monolayers, 12, 14 and 16 and rhodium layers 13 and 15 with 0 spin as shown in FIG. 1. The total energy of type I antiferromagnetism, which consists of (100) iron layers with parallel spins within one plane that are antiparallel with the spins in a neighboring iron layer, is close to, but higher, than the type II antiferromagnetism. Calculations have shown that the type II antiferromagnetic configurations are only slightly more stable than the ferromagnetic spin configuration and that at 0 K. temperature an applied magnetic field of 339 kOe will switch the antiferromagnetic spin arrangement to a ferromagnetic one. For ordered FeRh the iron local moments are 3 $\mu_B$ for both the antiferromagnetic and ferromagnetic configurations, while the rhodium local moments are 0 for the antiferromagnetic configuration and 1 $\mu_B$ for the ferromagnetic configuration.

Figure 2:
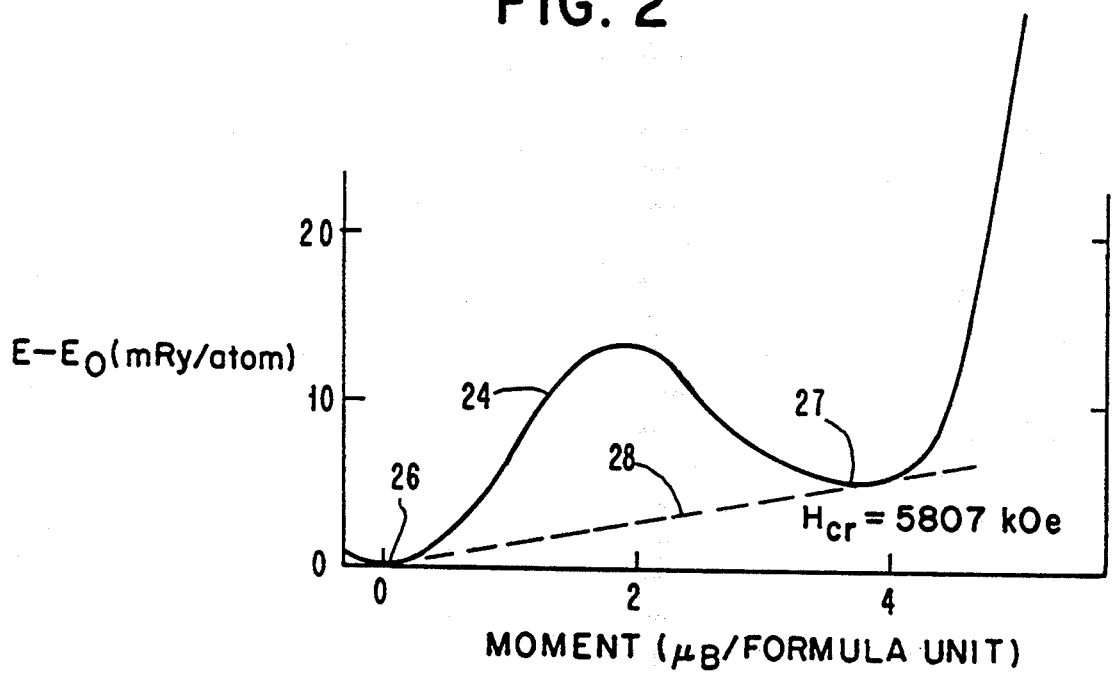
FIG. 2 is a graph of the calculated total energy E versus total moment M for FeRh.

FIG. 2 is a graph of the calculated total energy E versus the total magnetic moment M for FeRh. The calculations were made for FeRh having a lattice constant of 4.4% less than the equilibrium value. The volume per atom in magnetic cell 10 is 4/3 $r_{ws}^3$ where $r_{ws}$ is the Wigner-Seitz radius. Iron atoms and rhodium atoms are treated as occupying the same volume. The value of $r_{ws}$ is 2.66 a.u. in the calculations for FeRh. Curve 24 shows a stable antiferromagnetic minimum at M=0 at curve portion 26 and a metastable ferromagnetic minimum at M=about 4 $\mu_B$ shown by curve portion 27. Curve 24 was obtained by utilizing a fixed-spin-moment procedure that constrains a magnetic cell to have fixed values of total magnetic moment derived from collinear spins. The magnetic cell 10, as shown in FIG. 1, is made sufficiently large to allow for antiferromagnetism. The calculations plotted in FIG. 2 allow one to analyze the behavior of the magnetic cell 10 in an applied magnetic field H defined by equation 1.

$$H = dE/dM \qquad (1)$$

In Equation 1, E is the total energy and M is the total moment. In FIG. 2, the ordinate represents the total energy E and the abscissa represents magnetic moment M.

Figure 3:
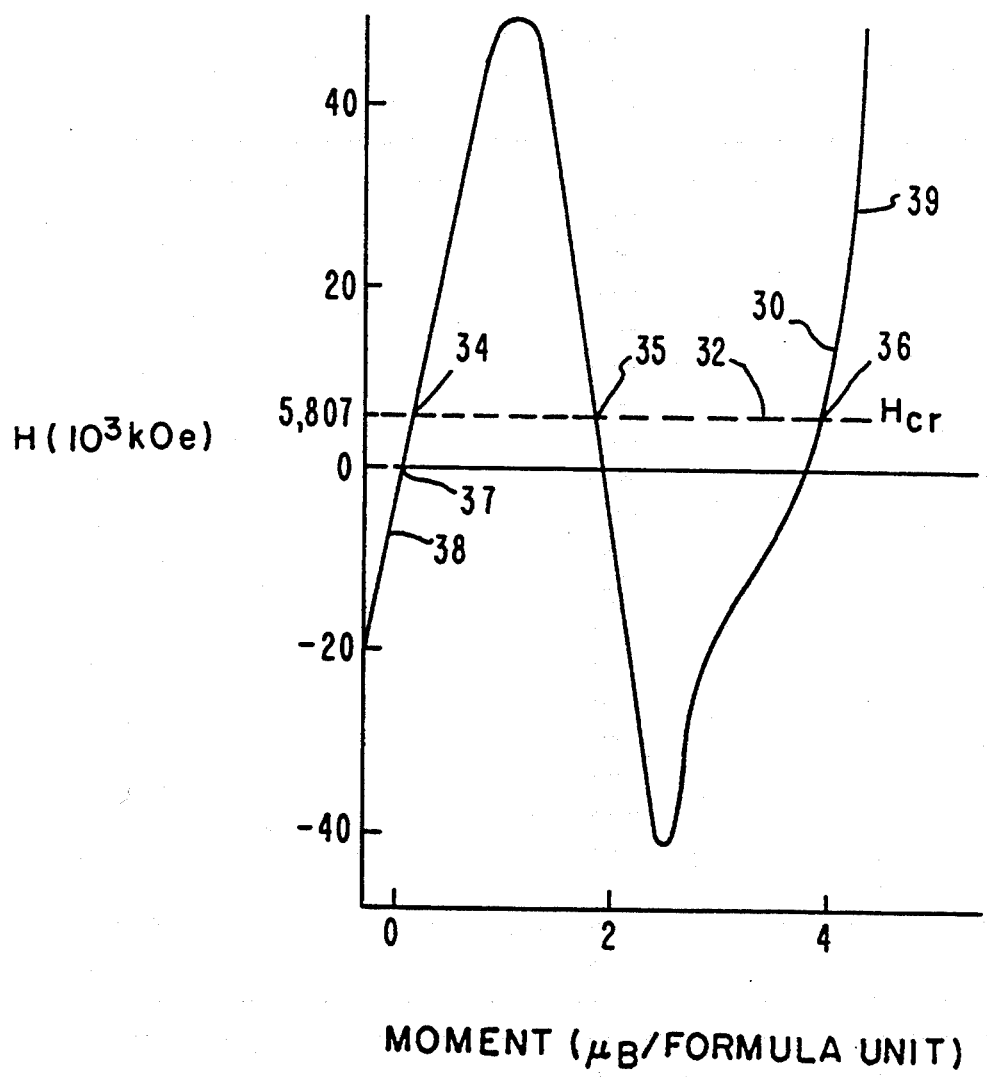
FIG. 3 is a graph based on calculations on an applied magnetic field H versus total moment M for FeRh.

FIG. 3 is a graph showing the relationship between the magnetic moment M of magnetic cell 10 shown in FIG. 1 and an applied magnetic field H calculated by differentiating curve 24 of FIG. 2. In FIG. 3, the ordinate represents applied field H and the abscissa represents magnetic moment M. Note that only certain parts of curve 24 in FIG. 2 are accessible to the system. At some critical magnetic field, $H_{cr}$, defined by the slope of the common tangent to the 2 minima shown by dashed line 28 tangent to curve portions 26 and 27, the two states, i.e. antiferromagnetic and ferromagnetic are in thermal dynamic equilibrium. The magnetic cell 10 will be in equilibrium in the ferromagnetic state for any applied field H which is greater than $H_{cr}$ shown by dashed line 32 in FIG. 3. The magnetic cell 10 will be in equilibrium in the antiferromagnetic state for any applied field less than $H_{cr}$. Dashed lined 32 intersects curve 30 at points 34 through 36. Below point 34 is curve portion 38 of curve 30. Curve portion 38 exhibits 0 moment for a 0 applied field at point 37. Curve portion 39 of curve 30 extends from point 36 upwards.

Figure 4:
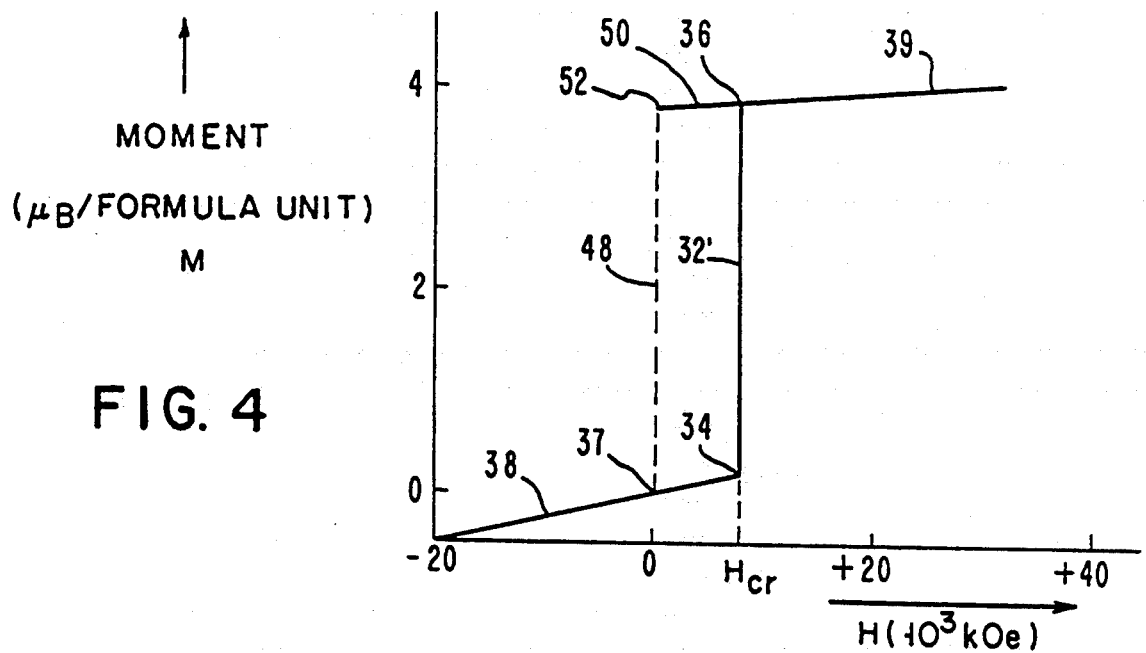
FIG. 4 is a graph based on calculations of the magnetization M of the material versus applied magnetic field H for FeRh.

FIG. 4 is a graph based on calculations shown in FIG. 3 of the moment M versus applied field H. In FIG. 4, the ordinate represents moment M and the abscissa represents applied field H. In FIG. 4, the ordinate and the abscissa are transposed with respect to the ordinate and abscissa of FIG. 3. The E (M) curve portions accessible to the system, curve portions 38 and 39 of curve 30 in FIG. 3 yields the response of the magnetization of FeRh to an applied field H. The critical field, $H_{cr}$ is about 5807 kOe required to switch FeRh from the antiferromagnetic to the ferromagnetic state which is large in comparison with typical switching fields for fabricated magnetic multilayers. However, the results shown in FIG. 2 apply to FeRh constrained to collinear spins on a rigid lattice (i.e. no zero-point motion) at a given volume (lattice constant). The calculations show that, at the equilibrium volume, $H_{cr}$ is reduced to 2100 kOe. A zero-point energy correction leads to a further reduction to about 339 kOe at zero temperature, in general agreement with observed critical fields $H_{cr}$. As noted above, $H_{cr}$ decreases with increasing temperature and at higher temperature goes linearly to 0 as the temperature approaches 340 K.

In FIG. 4, points 34 and 37 on curve portion 38 correspond to points 34 and 37 on curve portion 38 shown in FIG. 3. Dashed line 32 shown in FIG. 3 corresponds to line 32' in FIG. 4. Point 36 and curve portion 39 in FIG. 4 corresponds to point 36 and curve portion 39 in FIG. 3. At point 34, FeRh is antiferromagnetic and at point 36 the material is ferromagnetic. The data in FIGS. 3 and 4 were taken at room temperature, i.e. 300° K.

Figure 5:
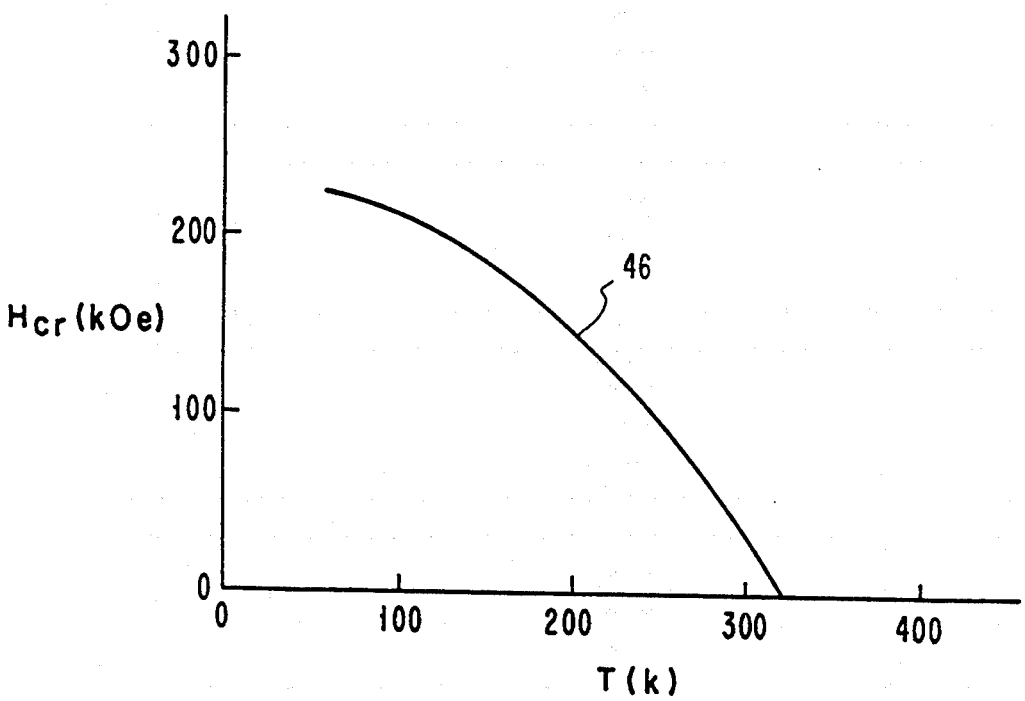
FIG. 5 is a graph of the critical field $H_{cr}$ versus temperature for FeRh.

FIG. 5 is a graph of the critical field $H_{cr}$ versus temperature for FeRh. In FIG. 5, the ordinate represents the applied field H and the abscissa represents temperature. In FIG. 5, the rhodium was 53.1%. Curve 46 shows that the critical field $H_{cr}$ decreases to 0 as the temperature increased to about 320 Kelvin. Thus, by heating FeRh the critical field $H_{cr}$ may be reduced to very low values such as in the range form 10 to 80 Oersteds to induce a transition form antiferromagnetic to ferromagnetic order in the material. The transition occurs very rapidly since there is mainly an electronic (spin flip) phase transition with little movement or repositioning of the atoms in the unit cell.

Referring again to FIG. 4, with FeRh heated very close to 320 K., dashed line 48 would represent the transition from point 37 to point 52. Point 37 represents antiferromagnetic material and point 52 representing ferromagnetic material. Curve portion 50 would connect to point 36 to point 52.

Figure 6:
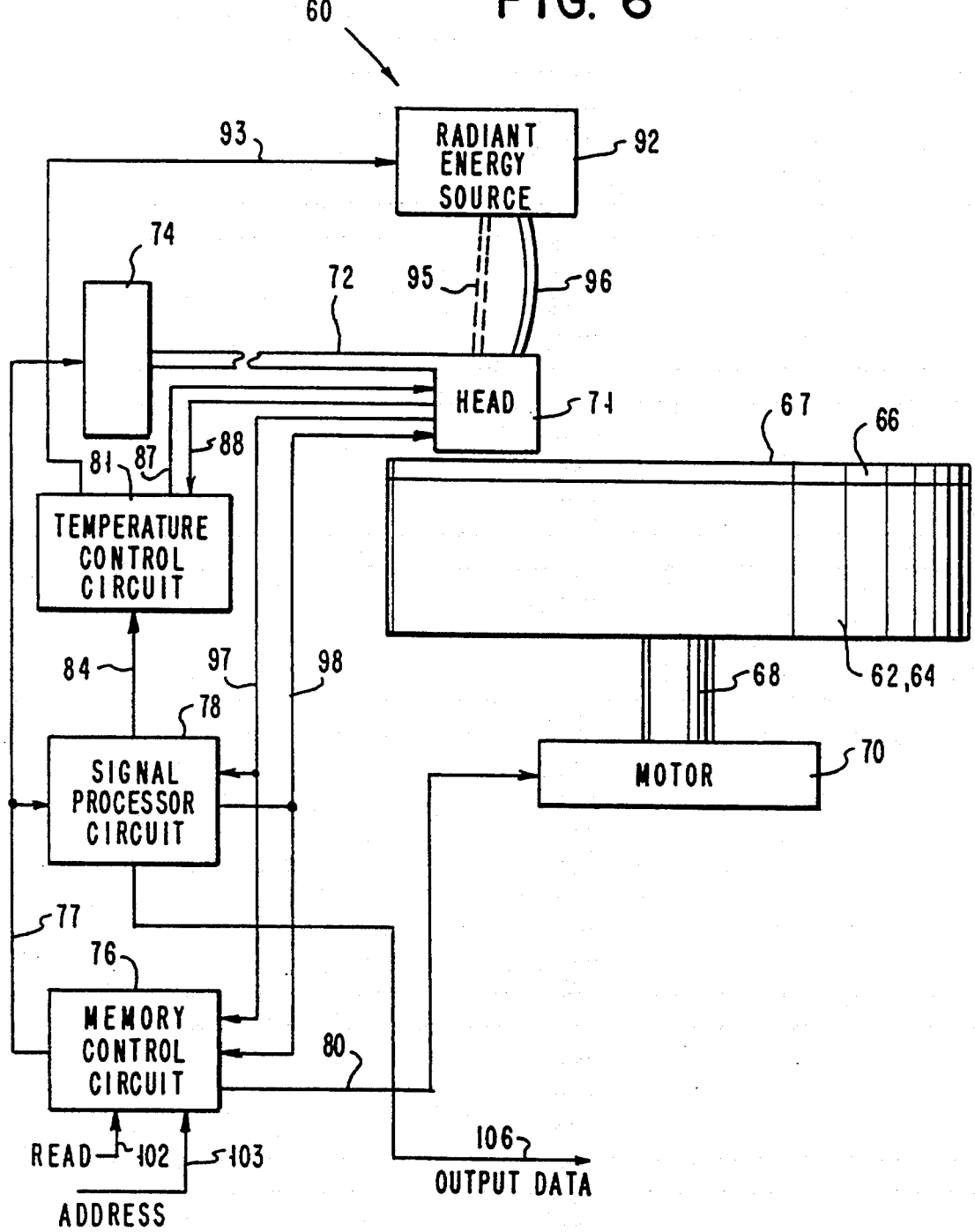
FIG. 6 is one embodiment of the invention.
Figure 7:
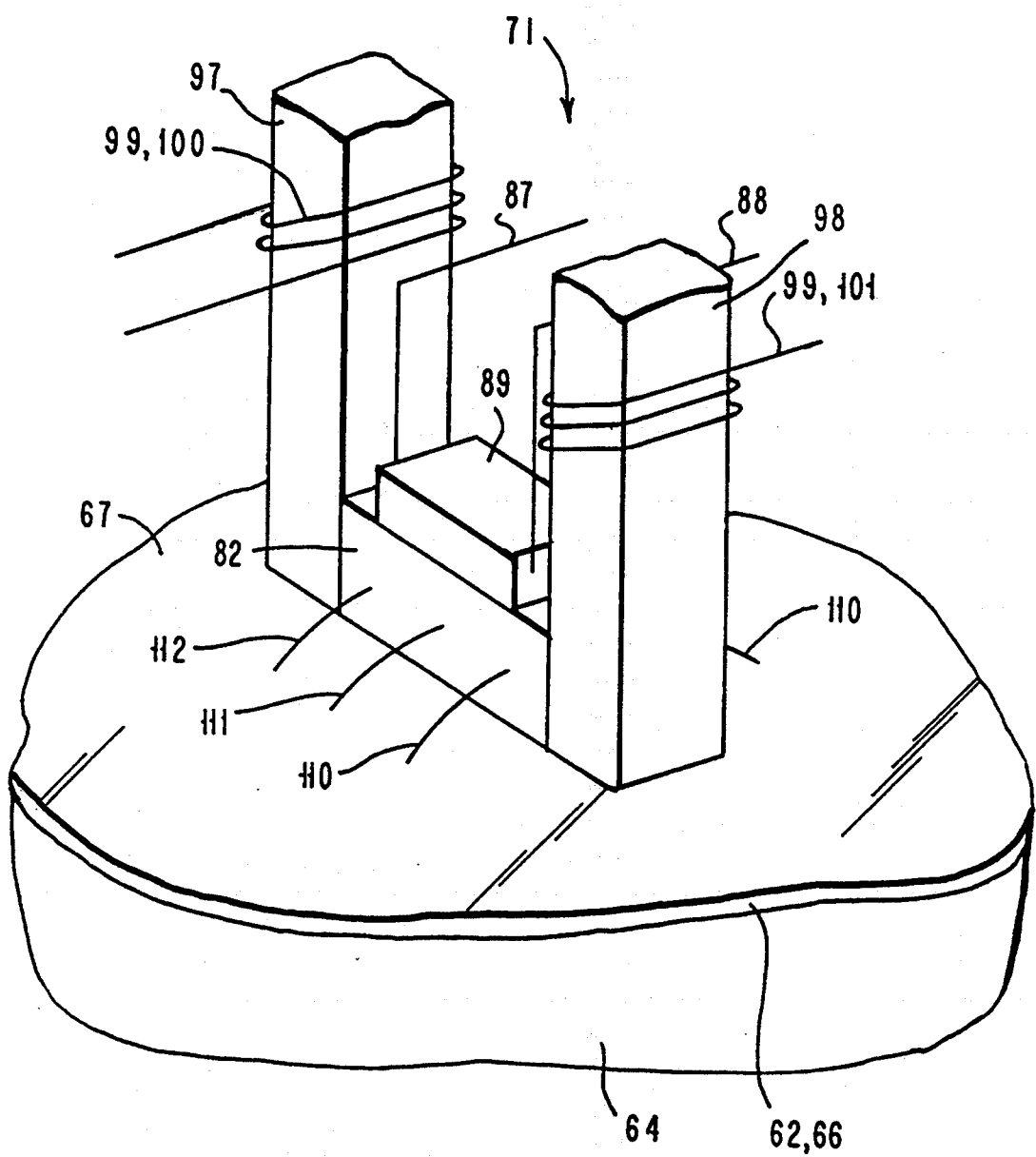
FIG. 7 is an enlarged partial view of a magnetic head embodying the invention and the disk.

Referring to FIG. 6, a memory 60 is shown which may be, for example, a direct access storage device (DASD). A disk 62 is shown having a substrate 64 and a magnetic layer 66 having an upper surface 67 positioned on substrate 64. Disk 62 is supported by spindle 68 which is coupled to motor 70 which functions to rotate spindle 68 and disk 62. Magnetic layer 66 may have data stored therein as a function of the orientation of magnetic fields within magnetic layer 66 and the associated magnetic field flux return paths directly above upper surface 67. Magnetic head 71, which is further described in FIG. 7, is positioned in close proximity to upper surface 67 to intercept magnetic fields leaving or entering upper surface 67. Magnetic head 71 is physically supported in position by a slider 72 which is controlled by actuator 74. Actuator 74 may be a solenoid.

Memory control circuit 76 functions to generate control signals over lead 77 to a control input of actuator 74 and to an input of signal processor circuit 78. Memory control circuit 76 also provides a control signal over lead 80 to motor 70.

Temperature control circuit 81 functions to control the temperature of material 82 in magnetic head 71. Material 82 is shown in FIG. 7. Signal processor circuit 78 provides one or more signals over lead 84 to temperature control circuit 81. Signal processor circuit 78 may function to indicate whether material 82 is antiferromagnetic or ferromagnetic under a predetermined magnetic field indicating whether the temperature of material 82 should be raised or lowered. Additional sensors comprised of material 82 or of other material may be positioned in magnetic head 71 and coupled to signal processor circuit 78 for determining the temperature conditions within magnetic head 71, and more particularly, of material 82 which is sensing or intercepting the magnetic fields above magnetic layer 66. The signal from signal processor circuit 78 over lead 84 may be a simple on and off control signal or may provide more information to temperature control circuit 81 to enable temperature control circuit 81 to control the temperature of material 82 at a predetermined temperature such as 340° K. within ±0.1 K. corresponding to a temperature below the transition temperature.

Temperature control circuit 81 may provide current over leads 87 and 88 to a heating element 89 shown in FIG. 7 positioned in magnetic head 71 for controlling the temperature of material 82. Heating element 89 may be, for example, a resistive heater formed by an alloy of nickel and chromium in the form of a layer or wire. Other materials may be used to provide heating element 89. Other forms of heating such as a radiant energy source 92 may be used to control the temperature of material 82. Radiant energy source 92 functions to provide radiant energy by way of a beam 95 or optical fiber 96 which is focussed on or directed on or through magnetic head 71 to control the temperature of material 82. Temperature control circuit 81 may provide a control signal over lead 93 to radiant energy source 92. Radiant energy source 92 may be a laser and may provide light beam 95 by way of an optical fiber 96.

Signal processor circuit 78 provides an electrical current to magnetic head 71 which may pass through material 82 to determine by way of its resistance whether material 82 is antiferromagnetically or ferromagnetically ordered. If material 82 is ferromagnetically ordered, the resistance of material 82 is much less resistant than at times when material 82 is antiferromagnetically ordered such as by an order of magnitude (10 times). Leads 97 and 98 from signal processor 78 function to provide a current path to and a return path from a material 82 to signal processor 78. Signal processor 78 functions to determine the resistance of material 82 and hence to determine whether material 82 is ferromagnetically ordered or antiferromagnetically ordered with respect to the applied magnetic field above upper surface 67 of magnetic layer 66. Leads 97 and 98 may be a cable of many leads to accommodate additional voltages being received from magnetic head 71.

Memory control circuit 76 functions to retrieve data previously stored in magnetic layer 66 in response to a read signal on lead 102 and an address signal on lead 103. Magnetic head 71, and more particularly, material 82 functions to measure the applied magnetic field by way of a transition from antiferromagnetic to ferromagnetic ordered material and to provide an analog or digital signal over leads 97 and 98 to signal processor circuit 78. Signal processor circuit 78 functions to process the signals received over leads 97 and 98 to provide an output signal on lead 106 indicative of the data retrieved from magnetic layer 66.

FIG. 7 is a simplified view of magnetic head 71 positioned over magnetic layer 66. Material 82 is shown positioned above upper surface 67 and between conductors 97 and 98 which function to provide current through material 82 to determine the resistivity of material 82. Heating element 89 is positioned adjacent heating material 82 to control the temperature of heating material 82 such as a value in the range 320 K. to 340 K. ±0.1 K. Leads 87 and 88 are coupled to heating element 89 to provide current through heating element 89. As shown in FIG. 7, heating element 89 is a bar of resistive material but alternately may be a wire or a thin film layer. A wire 99 may be wrapped around leads 97 and 98 to form coils 100 and 101 which heat leads 97 and 98 which in turn would raise the temperature of material 82. Magnetic field lines 110 through 112 are shown emanating from upper surface 67 of layer 66 and passing through material 82 which may be, for example, FeRh or FeRu. The magnetic field is sensed by determining whether material 82 has gone through a transition in its electronic state from antiferromagnetic material to ferromagnetic material by way of the resistance of material 82 which is greatly reduced in the ferromagnetic state.

FeRh is a unique binary metallic system with an antiferromagnetic ground state which can be switched to a ferromagnetic state with a predetermined magnetic field with no change in crystallographic structure. FeRu, FePd or MnPt are other unique binary metallic systems which may possibly be substituted for FeRh as material 82.

In FeRh, the magnetoresistance effect is enhanced by virtue of the special antiferromagnetic inter-plane and intra-plane spin configurations shown in FIG. 1. The simple crystal structure corresponding to a CsCl unit cell and related iron B2 systems results in an arrangement which has (100) iron layers with alternating spins within the planes, rhodium layers with zero spins, and successive iron layers coupled antiferromagnetically. An application of a magnetic field to the material aligns the iron spins both within and between (100) planes, and results in a sizeable rhodium moment. In other words, the rhodium makes a magnetic moment contribution in the ferromagnetic state. Because of the special spin arrangement in FeRh, the magnetoresistance effect is strongly enhanced, i.e. there is a giant magnetoresistance effect, so that magnetic heads made of this or related materials will be much more sensitive by providing a larger output voltage or a greater change in resistance. In addition, the sensitivity of the material is at a maximum near room temperature (300 K.) and can be controlled by a heating element.

The invention describes a device for detecting magnetic fields comprising a material consisting of at least one type of magnetic atom or ion and at least one type of nonmagnetic atom or ion, the magnetic atoms or ions being regularly arranged in a crystal interspaced with the nonmagnetic atoms or ions, the magnetic atoms or ions being antiferromagnetically aligned with all nearest neighbor magnetic atoms or ions in one electronic state and upon the application of a magnetic field, may change the alignment of the magnetic atoms or ions to a ferromagnetic order, the ferromagnetic order is detected by passing a current through the material and sensing the resistance of the material in the ferromagnetic order as opposed to the antiferromagnetic order.

While there has been described and illustrated an apparatus for detecting a magnetic field utilizing a material which transitions from the antiferromagnetic order to the ferromagnetic order, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An apparatus for detecting a magnetic field comprising:
    a material having a critical field $H_{cr}$ consisting of at least one type of magnetic atom or ion and at least one type of nonmagnetic atom or ion,
    said magnetic atoms or ions being regularly arrayed in a crystal interspersed with said nonmagnetic atoms or ions,
    said magnetic atoms or ions of said material at a predetermined temperature being antiferromagnetically aligned with all nearest neighbor magnetic atoms or ions at first times when said magnetic field to be detected being below the critical field $H_{cr}$ adjacent said material,
    said magnetic atoms or ions of said material at said predetermined temperature being changed to ferromagnetic order at second times when said magnetic field to be detected being increased above a predetermined value whereby the magnetic field in said material being greater than the critical field $H_{cr}$,
    first means for controlling the temperature of said material within a predetermined range, and
    second means for determining whether said material is ferromagnetically ordered.

2. The apparatus of claim 1 wherein said material is positioned in a head for use in retrieving data from magnetic storage media in a memory system.

3. The apparatus of claim 1 wherein said material is FeRh.

4. The apparatus of claim 1 wherein said second means includes third means for passing a current through said material, and
    fourth means for generating a signal indicative of the voltage across said material.

5. The apparatus of claim 1 wherein said first means includes means for controlling the temperature T of said material at T±0.1 Kelvin.

6. The apparatus of claim 1 wherein said temperature is below the transition temperature $T_{cr}$ of said material at a predetermined pressure.

7. The apparatus of claim 6 wherein said temperature is less than 0.1 K. below said transition temperature.

8. The apparatus of claim 1 wherein said magnetic atoms or ions are selected from the group consisting of Mn, Fe, Co and Ni.

9. The apparatus of claim 1 wherein said material is Mn Pt.

10. The apparatus of claim 1 wherein said material is FeRh.

11. The apparatus of claim 1 wherein said material is selected from the group consisting of MnPt and FePd.

12. A memory system for retrieving data stored in a magnetic layer comprising:
    a disk including said magnetic layer thereon, said material having a critical field $H_{cr}$,
    a positioner for moving said disk relative to a head, said head positioned to intercept magnetic flux emerging or returning to said magnetic layer for generating signals indicative of the data stored in said magnetic layer, said head including a material consisting of at least one type of magnetic atom or ion and at least one type of nonmagnetic atom or ion, said magnetic atoms or ions being regularly arrayed in a crystal interspersed with said nonmagnetic atoms or ions, said magnetic atoms or ions of said material at a predetermined temperature being antiferromagnetically aligned with all nearest neighbor magnetic atoms or ions at first times when said magnetic field to be detected being below the critical field $H_{cr}$ adjacent said material, said magnetic atoms or ions of said material at said predetermined temperature being changed to ferromagnetic order at second times when said magnetic field to be detected being increased above a predetermined value whereby the magnetic field in said material being greater than the critical field $H_{cr}$, first means for controlling the temperature of said material with a predetermined temperature range, and second means for determining whether said material is ferromagnetically ordered.

13. The memory system of claim 12 wherein said second means includes third means for passing a current through said material, and fourth means for generating a signal indicative of the voltage across said material.

14. The memory system of claim 12 wherein said material is FeRh.

15. The memory system of claim 12 wherein said first means includes means for controlling the temperature of said material at T±0.1 Kelvin.

16. The memory system of claim 12 wherein said magnetic atoms or ions are selected form the group consisting of Mn, Fe, Co and Ni.

17. The memory system of claim 12 wherein said material is MnPt.

18. The memory system of claim 12 wherein said material is FeRu.

19. The memory system of claim 12 wherein said material is selected form the group consisting of MnPt and FePd.

20. The memory system of claim 12 wherein said temperature is below the transition temperature $T_{cr}$ of said material at a predetermined pressure and at a predetermined applied magnetic field.

21. The memory system of claim 20 wherein said temperature is less than 0.1 K. below said transition temperature.

22. A magnetoresistive sensor positioned in the head of head/disk assembly comprising:

a material consisting of FeRh having a surface adapted for positioning in the proximity of the surface of said disk, first means for controlling the temperature of said material within a predetermined temperature range whereby said FeRh transitions from an antiferromagnetic state to a ferromagnetic state in a first predetermined magnetic field and from a ferromagnetic state to an antiferromagnetic state in a second predetermined magnetic field, second means for passing electrical current through said material, and third means for generating a signal indicative of the voltage across said material.

23. The magnetoresistive sensor of claim 22 further including a head housing for supporting said material, said head housing adapted for attachment to a slider.

24. A method for detecting a magnetic field comprising the steps of:

selecting a material having a critical field $H_{cr}$, said material consisting of at least one type of magnetic atom or ion and at least one type of nonmagnetic atom or ion, said magnetic atoms or ions being regularly arrayed in a crystal interspersed with said nonmagnetic atoms or ions, said magnetic atoms or ions of said material at a predetermined temperature being antiferromagnetically aligned with all nearest neighbor magnetic atoms or ions at first times when said magnetic field to be detected being below the critical field $H_{cr}$ adjacent said material, said magnetic atoms or ions of said material at a predetermined temperature being changed to ferromagnetic order at second times when said magnetic field to be detected being increased above a predetermined value whereby the magnetic field in said material being greater than the critical field $H_{cr}$, controlling the temperature of said material within a predetermined temperature range, and determining whether said material is ferromagnetically ordered.

25. The method of claim 24 further including the step of positioning said material in a head for use in retrieving data from magnetic storage media in a memory system.

26. The method of claim 24 wherein said step of determining includes the steps of passing a current through said material, and generating a signal indicative of the voltage across said material.

27. The method of claim 24 wherein said step of controlling includes the step of controlling the temperature of T± said material at T±0.1 Kelvin.

28. The method of claim 24 wherein said step of controlling includes the step of selecting said predetermined temperature range below the transition temperature $T_{cr}$ of said material at a predetermined pressure and at a predetermined applied magnetic field.

29. The method of claim 24 wherein said step of controlling includes the step of selecting a temperature wherein said temperature is less than 0.1 K. below the transition temperature $T_{cr}$ of said material at a predetermined pressure and at a predetermined applied magnetic field.

30. The method of claim 24 wherein said step of selecting a material includes selecting a material with magnetic atoms or ions selected from the group consisting of Mn, Fe, Co and Ni.

31. The method of claim 24 wherein said step of selecting a material includes selecting a material from the group consisting of FeRh, FeRu, FePd and MnPt.

* * * * *